United States Patent [19]

Loper

[11] 4,387,334
[45] Jun. 7, 1983

[54] BATTERY MONITOR CIRCUIT

[75] Inventor: Roger K. Loper, Norway, Iowa

[73] Assignee: Rockwell International Corporation, El Segundo, Calif.

[21] Appl. No.: 270,705

[22] Filed: Jun. 5, 1981

[51] Int. Cl.³ .............................................. H02J 7/04
[52] U.S. Cl. ..................................................... 320/44
[58] Field of Search ............................ 320/44, 43, 48; 340/606; 429/7, 90, 92, 93

[56] References Cited

U.S. PATENT DOCUMENTS

| 4,153,867 | 5/1979 | Jungfer et al. | 320/48 X |
| 4,217,645 | 8/1980 | Barry et al. | 320/48 X |
| 4,289,836 | 9/1981 | Lemelson | 429/93 X |
| 4,304,823 | 12/1981 | Lemelson | 429/93 X |

FOREIGN PATENT DOCUMENTS 2845511  5/1979  Fed. Rep. of Germany ........ 320/44
2344164 10/1977  France ................................. 320/44

Primary Examiner—William M. Shoop
Attorney, Agent, or Firm—Richard K. Robinson; Howard R. Greenberg; H. Fredrick Hamann

[57] ABSTRACT

A battery monitoring system for monitoring the status of a battery provides for including within the battery package a nonvolatile memory for storing digital data symbols representative of the power that has been supplied by the battery. The equipment in which the battery is utilized has associated with it a power monitor system that senses the power delivered by the battery and converts the sense power into digital data symbols which are applied to the nonvolatile memory for accumulation and thereby maintains a permanent record of the power that has been supplied by the battery.

6 Claims, 4 Drawing Figures

BATTERY MONITOR CIRCUIT

BACKGROUND OF THE INVENTION

The Government has rights in this invention pursuant to contract Number DAAB07-78-C-0160 awarded by the U.S. Army.

This invention relates to battery monitoring systems and, in particular, battery monitoring systems that make available the total ampere-hours that have been supplied by a battery since its manufacture.

There are essentially two prior art methods of determining the condition of a battery. One method measures the battery voltage and the other method measures power drain during the "ON" time of the equipment in which the battery is being utilized.

U.S. Pat. No. 4,193,026 to Finger et al. and U.S. Pat. No. 4,017,724 to Finger provide examples of apparatuses that are able to ascertain the depletion of a battery or the state of charge by measuring the output voltage and indicate when the output voltage from the battery falls below a threshold value.

The discharge rate of the newer type batteries such as lithium batteries if plotted as output voltage versus time would be an essentially flat curve, and thus it is not possible to obtain an accurate indication of the battery conditions by measuring the cell voltage.

Determining the battery condition from the accumulated equipment "ON" time is difficult, particularly if the battery drain is not constant, and it often relies upon the manual entry of data or resetting of the equipment "ON" time when a battery is exchanged. In addition, batteries that are utilized in monitoring systems that depend on equipment "ON" time cannot be transferred from one piece of equipment to another with out losing the accumulated use history.

SUMMARY OF THE INVENTION

A battery monitoring system for monitoring the status of a battery provides for including within the battery package a nonvolatile memory for storing digital data symbols representative of the power that has been supplied by the battery. The equipment in which the battery is utilized has associated with it a power monitor system that senses the power delivered by the battery and converts the sense power into digital data symbols which are applied to the nonvolatile memory for accumulation and thereby maintains, a permanent record of the power that has been supplied by the battery.

The accumulated power may be displaced through the use of an ampere-hour display unit that includes a multiplexer controller which interfaces with the power monitor system and transfers the contents of the nonvolatile memory to the ampere-hour display. The circuits are arranged so that only a minimum number of electrical connections between the battery case in which the nonvolatile memory is mounted and the equipment to which battery is connected including the power monitor system and ampere-hour display unit are used.

It is the object of this invention to provide a battery monitoring system that will ensure that an accurate record of the power supplied by the battery is maintained with the battery at all times.

It is also an object of this invention to provide a battery monitoring system that maintains an accurate reading of the power that has been dissipated by the battery even when the battery is inactive with only the additional dissipation of a few milliwatts of power during both the inactive and active periods.

It is still further an object of this invention to provide a battery monitoring system that has a means for extracting the power history of a battery from the battery itself with a minimum number of interface connections between the battery and the means for extracting the power history of the battery.

BRIEF DESCRIPTION OF THE DRAWINGS

The advantages of the present invention may be ascertained from a reading of the specification and claims in conjunction with the drawings in which:

DETAILED DESCRIPTION OF THE PREFERRED EMBODIMENT

Figure 1:
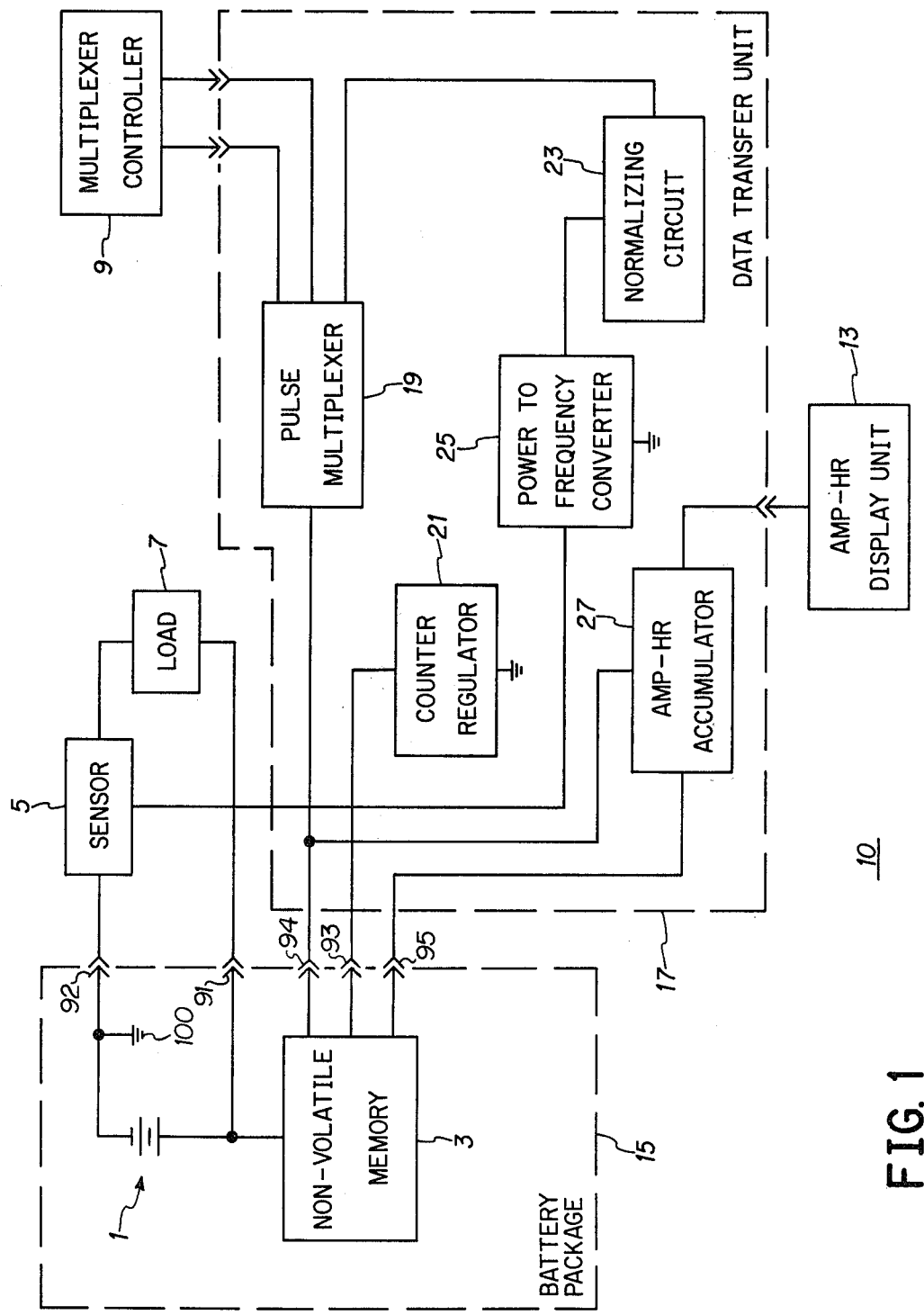
FIG. 1 is a block diagram of the battery monitoring system according to the invention.

In FIG. 1, to which reference should now be made, there is shown a battery monitoring system 10 in which there is a battery package 15, a data transfer unit 17, a multiplexer controller 9 and an ampere-hour display unit 13. The battery package 15 contains a battery 1, which is the battery to be monitored, a nonvolatile memory 3, a return ground 100, a positive battery output terminal 91, a negative battery output terminal 92 and interface terminals 93, 94, to the nonvolatile memory 3 and an output terminal 95 from the nonvolatile memory 3.

The output from the battery 1, that is provided across terminals 91 and 92 is applied to a load 7. In series with the load 7 is a sensor 5 that senses or monitors the power that is provided to the load 7. The data transfer unit 17 accepts the output from sensor 5 and converts it into data for storage in the nonvolatile memory 3, and includes a power to frequency converter 25 for converting the signal that is provided from the sensor 5 into a signal that a normalizing circuit 23 will respond. In the preferred embodiment this is a time and amplitude discrete digital signal. The normalizing circuit 23 normalizes the output of the power to frequency converter 25 into a more readily acceptable unit, such as converting the output of the power to frequency converter 25 from, as an example, milliwatts to watts. A pulse multiplexer 19 depending on the absence of the multiplexer controller 9 or the appropriate command from a multiplexer controller 9, if present, will multiplex or direct the output from the normalizing circuit 25 to the nonvolatile memory 3 via the terminal 94. The multiplexer controller 9, also controls the pulse multiplexer 19 and consequently, the nonvolatile memory 3 when the nonvolatile memory 3 transfers its ampere-hour contents to an ampere-hour accumulator 27. An AMP-hour accumulator 27 serves as an interface between the nonvolatile memory 3 of a battery that is powering the equipment in which the data transfer unit is a part of and the AMP-hour display unit 13, an optional piece of equipment used to read the contents of the AMP-hour accumulator 27. AMP-hour, as used herein refers to ampere-hour, which when known can be related to the power dissipated by the battery 1. The AMP-hour display unit 13, is just a device for indicating contents of the AMP-hour accumulator 27 and can be a decimal display unit, a printout unit, or after analog conversion is performed, a strip chart recorder.

Figure 2:
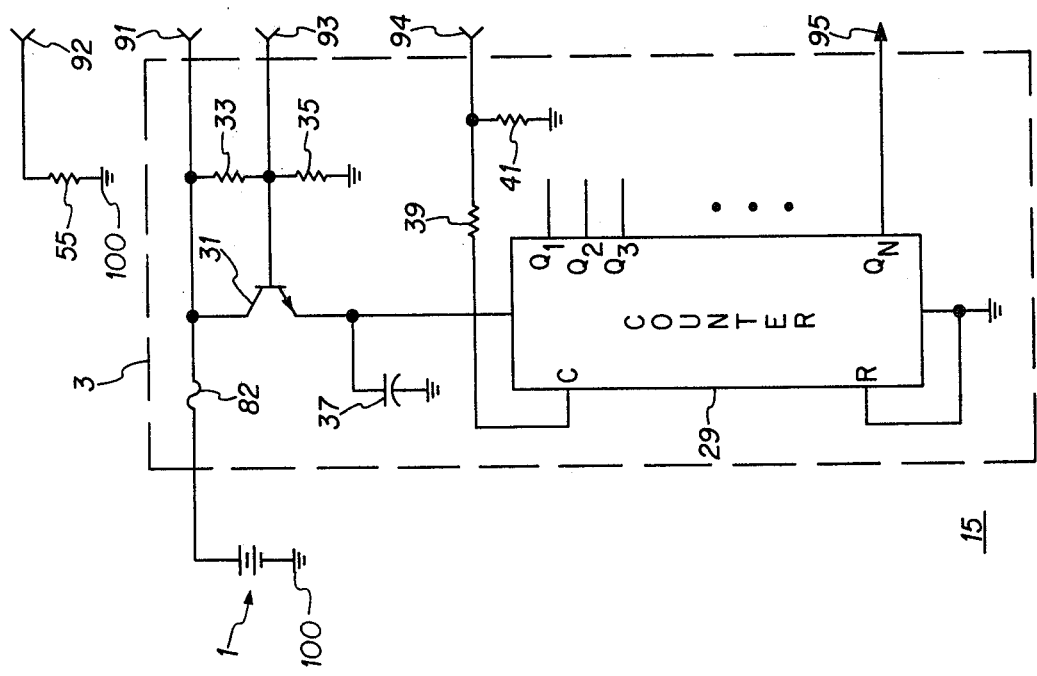
FIG. 2 is a schematic diagram of the battery package of FIG. 1.

FIG. 2 is a schematic diagram of the battery package which contains the nonvolatile memory 3 that includes a counter 29 that can accumulate up to $2^N$ counts where N is a positive integer. There is associated with the counter 29 a voltage regulator which regulates the voltage provided by the battery 1 at a voltage level that is compatible with the voltage requirements of the counter 29. The regulator includes a transistor 31 and a filter capacitor 37, as well as a pair of biasing resistors 33 and 35, which are selected to ensure that the voltage supplied to the counter 29 by the transistor 31 is in the acceptable range for the counter 29. Fuse 82 protects both the battery 1 as well as the nonvolatile memory 3 from short circuits or excessive loading of the battery 1. In the preferred embodiment, the current sensor 5 is a resistor 55 which is encapsulated within the battery package 15. The resistor 55 is in series with the return line from terminal 92 and the return ground 100 in the battery package 15.

The counter 29 accepts inputs from the pulse multiplexer 19 of FIG. 1 via conductor 94. The pulses are applied to the clock input C of the counter 29 and cause the counter 29, to increment in value all the way up to $2^N$ pulses. Resistors 39 and 41 are used to interface the logic level from the pulse multiplexer 19 to the logic level expected by the counter 29. Terminal 95 is connected to the $Q_N$ terminal of the counter 29 and is used for transferring the contents of the counter 29 to the AMP-hour accumulator 27 of FIG. 1. The operation of the transfer of the data from the counter 29 to the AMP-hour accumulator 27 will be discussed later. Terminal 93 is used to provide a regulated bias to the transistor 31 from the counter regulator 21 of FIG. 1. Terminal 91 provides the positive terminal connection to the battery 1 and the equipment to which the battery is supplying power.

Figure 3:
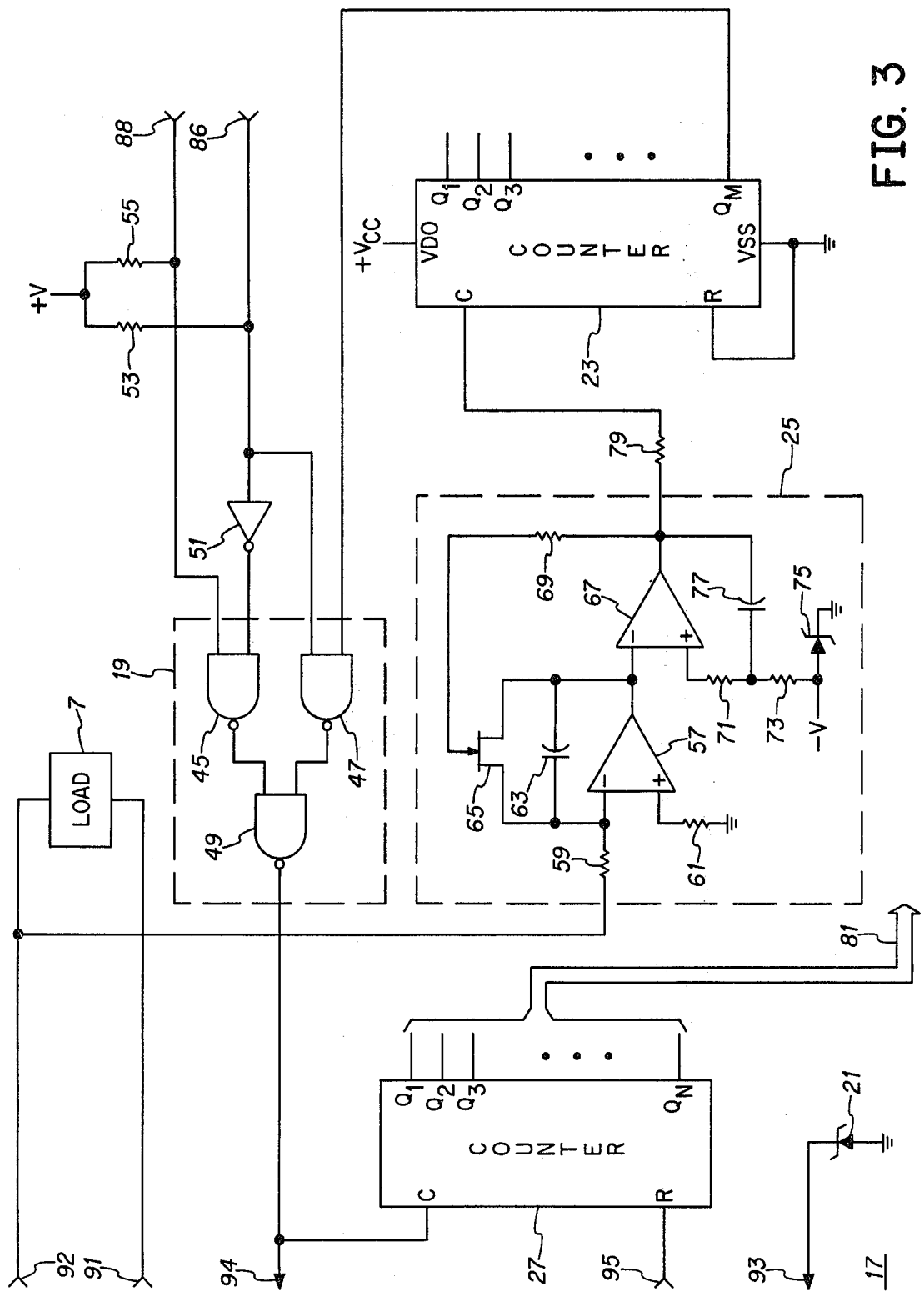
FIG. 3 is a schematic diagram of the battery monitoring system of FIG. 1.

FIG. 3, to which reference should now be made, should be used in conjunction with FIG. 2. The AMP-hour accumulator 27 is shown as a counter 27 which has $Q_N$ data symbol capacity. The counter 27, as does the counter 29 of FIG. 2 stores the output data symbols that are provided by the pulse multiplexer 19. The pulse multiplexer 19 implements the multiplexing functions through the operation of 3 NAND gates 45, 47 and 49 and controls the transfer of data either to the counter 27 and 29 or from the counter 29 of FIG. 2. The explanation of which will be provided later. The power to frequency converter 25 comprises an integrator circuit that includes an operational amplifier 57 and a feedback capacitor 63. A voltage that is developed across the resistor 5, as a result of the current flow through the load 7, is applied via resistor 59 to the operational amplifier 57. The current through resistor 59 that results from the voltage indicating the current flow through resistor 55 charges capacitor 63. Resistor 61 is an offset compensating resistor. The charging of the capacitor 63 places a potential on the negative terminal of the operational amplifier 67. On the positive terminal of the operational amplifier 67, is a threshold potential that is established by the zener diode 75 and the resistors 71 and 73. When the charge on the negative terminal on the amplifier 67 exceeds the charge on the positive terminal of the amplifier 67, then the output of the amplifier 67 swings positive causing the filed effect transistor 65 to short and thus, neutralize the charge across the capacitor 63. The operational amplifier 67 is coupled to the field effect transistor 65 via resistor 69. The shorting of capacitor 63 lowers the potential on the negative terminal of the operational amplifier 67 below the reference threshold resulting in a pulse output from the operational amplifier 67. This pulse output is used to clock the normalizing circuit 23 which in the preferred embodiment is an M-bit counter. The normalizing circuit will provide one pulse on the $Q_m$ output for each $2^M$ pulses on the clock input.

If there is a positive logic level which means a logic one state, on the input of the inverter 51, as shown in the connection of FIG. 3, and provided by the volt source and resistor 53, then the NAND gate 47 will pass a negative going pulse to the input of NAND gate 49. The NAND gate 45, in the circuit arrangement shown in FIG. 3, has a positive logic level on its output and thus, NAND gate 49 provides a positive logic pulse on its output terminal and terminal 94. The positive logic level on terminal 94 both clocks or increments the counter 27 as well as the counter 29.

Zener diode 21 establishes a more precise regulation for the transistor 31, and thus for the voltage to the counter 29 when the battery 1 is not only connected to the load 7, but also to the data transfer unit.

Figure 4:
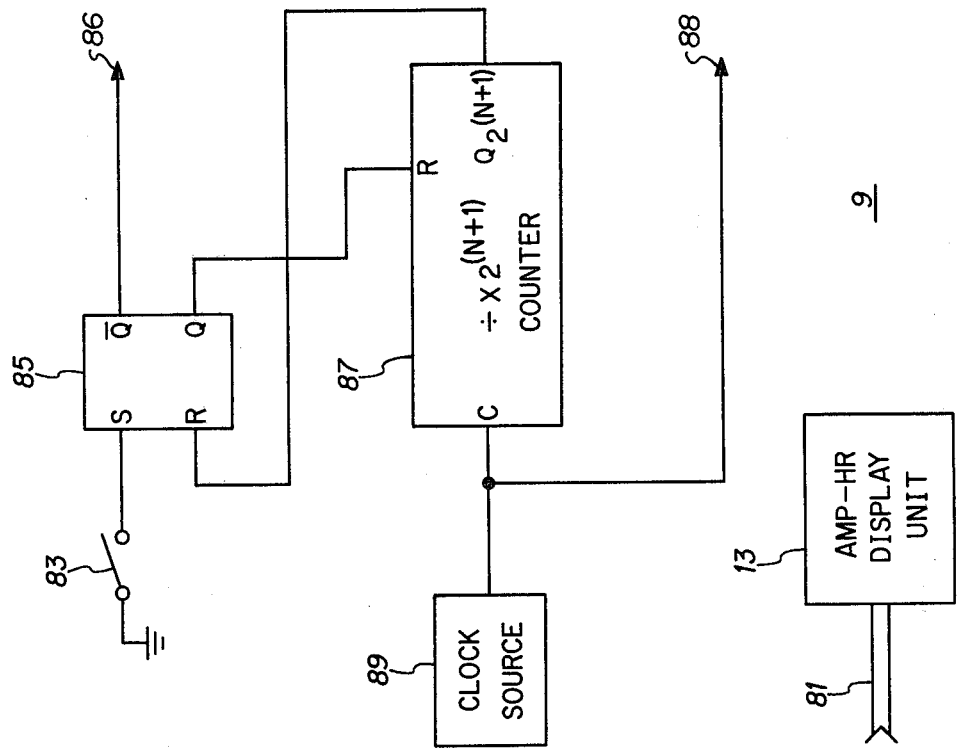
FIG. 4 is a schematic diagram of a multiplexer controller and ampere-hour display unit of FIG. 1.

FIG. 4, is a block diagram of the multiplexer controller 9 and the AMP-hour display unit 13 and it should be used in conjunction with FIGS. 1, 2 and 3. The terminal numbers shown in FIGS. 1, 2 and 3 indicate the connections of the three units. FIGS. 2 and 3 in the preferred embodiment operates together and need not have the multiplexer controller 9 and AMP-hour display 13 connected or associated with them unless there is a desire to read the contents of the nonvolatile memory 3. Under normal conditions, resistors 55 and 53 hold terminals 86 and 88 to the potential that is provided by the positive voltage source. This ensures that NAND gate 45 has a positive logic level on its output terminal and consequently, NAND gate 49 responds only to the logic levels that are provided by the NAND gate 47. In the situation where it is desirable to read the contents of the counter 29 of the battery 1, the switch 83 is momentarily closed setting the RS flip-flop's 85 Q terminal to a positive logic level or logic one, in the preferred embodiment, on terminal 86. This action causes NAND gate 47 to have a logic one voltage level on its output terminal, thus making NAND gate 49 respond only to the output logic levels that are provided by the NAND gate 45. The NAND gate 45 via terminal 88 is now ready to accept the clock pulses that are provided by clock source 89 via the terminal 88 to the NAND gate 45. The clock source also applies clock pulses to the clock terminal C of the divide by $2^{(N+1)}$ counter 87. The divide by $2^{(N+1)}$ counter 87 is enabled by the RS flip-flop 85 being set in that the Q terminal provides a positive going pulse to the Reset (R) terminal of the divide by $2^{(N+1)}$ counter 87. As long as there is a positive pulse on the (R) terminal of the divide by $2^{(N+1)}$ counter 87, then the counter will accept the pulses from the clock source 89. At the accumulation of $2^{(N+1)}$ counts the $Q_2(N+1)$ terminal provides a reset pulse that resets the RS flip-flop 85, removing the logic zero from terminal 86, and thus disenabling that channel of the pulse multiplexer 19 upon which the clock pulses from the clock source 89 are applied. The contents of the counter 27, now contain an exact replica of the contents of the counter 29, which is of course, part of the battery package 15. This was accomplished by the counter 29 at the accumulation of $Q_N$ pulses resetting the counter 27 via the terminal 95 by providing a positive logic level or logic one to the Reset (R) terminal of the counter 27. The counter 27 accumulates pulses until its contents reaches the original value that was accumulated by the counter 29. The counter 87 only accumulates up to $2_N$ pulses before the removal of the clock pulses from terminal 94 by the pulse mutiplexer 19.

Table 1 illustrates the operational of the transfer of data from counter 29 to counter 27. In the example shown in Table 1, N is equal to 12. In this example, counter 29 has stored in it 434 counts. It is immaterial what the accumulation is in counter 27. The divide by $2^{(N+1)}$ counter 87 will, in the example, accumulate 4096 pulses before the resetting the RS flip-flop 85. At the expiration of 1614 counts there is a logic one on terminal 95 from the $Q_N$ terminal of the counter 29. This logic one is applied from terminal 95 to the reset terminal of the counter 27. Counter 27 is held reset by the logic one level from the $Q_M$ terminal of the counter 29 until the 3662 clock pulses are accumulated by the divide by $2^{(N+1)}$ counter 87.

TABLE 1

| OUTPUTS FROM COUNTER 29 | | | | | | | | | | | | "CLOCK" PULSES ON | OUTPUTS FROM COUNTER 27 | | | | | | | | | | | |
|---|---|---|---|---|---|---|---|---|---|---|---|---|---|---|---|---|---|---|---|---|---|---|---|---|
| Q12 | Q11 | Q10 | Q9 | Q8 | Q7 | Q6 | Q5 | Q4 | Q3 | Q2 | Q1 | TERMINAL 94 | Q12 | Q11 | Q10 | Q9 | Q8 | Q7 | Q6 | Q5 | Q4 | Q3 | Q2 | Q1 |
| 0 | 0 | 0 | 1 | 1 | 0 | 1 | 1 | 0 | 0 | 1 | 0 | 0 | X | X | X | X | X | X | X | X | X | X | X | X |
| 0 | 0 | 0 | 1 | 1 | 0 | 1 | 1 | 0 | 0 | 1 | 1 | 1 | X | X | X | X | X | X | X | X | X | X | X | X |
| 0 | 0 | 0 | 1 | 1 | 0 | 1 | 1 | 0 | 1 | 0 | 0 | 2 | X | X | X | X | X | X | X | X | X | X | X | X |
| . | | | | | | | | | | | | . | . | | | | | | | | | | | |
| 0 | 1 | 1 | 1 | 1 | 1 | 1 | 1 | 1 | 1 | 1 | 1 | 1613 | X | X | X | X | X | X | X | X | X | X | X | X |
| $1_R$ | 0 | 0 | 0 | 0 | 0 | 0 | 0 | 0 | 0 | 0 | 0 | 1614 | 0 | 0 | 0 | 0 | 0 | 0 | 0 | 0 | 0 | 0 | 0 | 0 |
| $1_R$ | 0 | 0 | 0 | 0 | 0 | 0 | 0 | 0 | 0 | 0 | 1 | 1615 | 0 | 0 | 0 | 0 | 0 | 0 | 0 | 0 | 0 | 0 | 0 | 0 |
| . | | | | | | | | | | | | . | . | | | | | | | | | | | |
| $1_R$ | 1 | 1 | 1 | 1 | 1 | 1 | 1 | 1 | 1 | 1 | 1 | 3661 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 3662 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 1 | 3663 | 0 | 0 | 0 | 0 | 0 | 0 | 0 | 0 | 0 | 0 | 0 | 1 |
| . | | | | | | | | | | | | . | . | | | | | | | | | | | |
| 0 | 0 | 0 | 1 | 1 | 0 | 1 | 1 | 0 | 0 | 0 | 1 | 4095 | 0 | 0 | 0 | 1 | 1 | 0 | 1 | 1 | 0 | 0 | 0 | 1 |
| 0 | 0 | 0 | 1 | 1 | 0 | 1 | 1 | 0 | 0 | 1 | 0 | 4096 | 0 | 0 | 0 | 1 | 1 | 0 | 1 | 1 | 0 | 0 | 1 | 0 |

X = DON'T CARE
R = RESET ON TERMINAL 95 AND COUNTER'S 27 RESET

When the divide by $2^{(N+1)}$ counter 87 has accumulated, in the embodiment shown, 4096 pulses, then the contents that were originally stored in the counter 29 is stored in the counter 27 or in the example 434 pulses. It should be noted that the counter 29 although it has cycled through 4096 clock pulses, again contains 434 counts thus protecting the integrity of the data stored in the battery 1. The counter 27 has stored therein a mirror image of the counter 29 and has on its output terminals $Q_1$ through $Q_N$ these pulses. Conductor bundle 81 when connected from the $Q_1$ through $Q_N$ terminals make this data available to the AMP-hour display unit 13, which in the preferred embodiment will display the contents of the counter 27 and consequently the contents of counter 29.

Many changes and modifications in the above described embodiments of the invention can of course, be carried out without departing from the scope, thereof. Accordingly, the invention is disclosed and is intended to be limited only by the scope of the appended claims.

I claim:

1. A battery monitoring system comprising:
    a battery encased within a battery package;
    a nonvolatile memory means having a memory capacity of N data symbols enclosed within the battery package for accumulating data symbols representative of the power provided by the battery;
    a sensor means for sensing the power delivered by the battery to provide a first signal representative of the sensed power; and
    converter means for converting the first signal to a stream of digital data pulses to which the nonvolatile memory will respond.

2. A battery monitoring system according to claim 1 further comprises:
    a memory means; and
    transfer means for transferring the contents of a nonvolatile memory means to the memory means.

3. The battery monitoring system according to claims 1 or 2 wherein the sensor means and the converter means comprises:
    a resistor means in series with the battery and the load for developing a voltage representative of the current flow between the battery and the load;
    current integrator means for integrating the voltage over time; and
    converter means for converting the output of the integrator means to pulses representative of discrete units of charge accumulated by the integrator means.

4. The battery monitoring system according to claims 1 or 2 further comprises:
    display means of displaying the contents of the memory means.

5. A method of monitoring the power supplied by a battery that is enclosed in a battery package, the method comprising the steps of:
    sensing the power delivered by the battery;
    providing a first signal representative of the sensed power;
    connecting the first signal into a stream of digital pulses; and
    accumulating the digital pulses within a nonvolatile memory enclosed within the battery package.

6. The method according to claim 5, wherein the step of converting the first signal into a stream of digital pulses further comprises:
    integrating the first signal over time; and
    converting the integrating first signal to pulses representative of discrete limits of the integrating first signal.

* * * * *